(12) United States Patent
Kim

(10) Patent No.: US 9,865,669 B2
(45) Date of Patent: Jan. 9, 2018

(54) ORGANIC LIGHT EMITTING DIODE DISPLAY AND MANUFACTURING METHOD THEREOF

(71) Applicant: SAMSUNG DISPLAY CO., LTD., Yongin-si, Gyeonggi-do (KR)

(72) Inventor: Se Dong Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/066,361

(22) Filed: Mar. 10, 2016

(65) Prior Publication Data
US 2017/0077205 A1 Mar. 16, 2017

(30) Foreign Application Priority Data
Sep. 16, 2015 (KR) .................. 10-2015-0131110

(51) Int. Cl.
*H01L 29/08* (2006.01)
*H01L 27/32* (2006.01)
(Continued)

(52) U.S. Cl.
CPC ...... *H01L 27/3276* (2013.01); *H01L 27/3279* (2013.01); *H01L 51/0012* (2013.01);
(Continued)

(58) Field of Classification Search
CPC ............. H01L 27/3276; H01L 51/0012; H01L 51/5203; H01L 51/56; H01L 27/322;
(Continued)

(56) References Cited

U.S. PATENT DOCUMENTS 6,900,470 B2 * 5/2005 Kobayashi .......... H01L 27/3244
257/40
7,420,212 B2 * 9/2008 Kim .................... H01L 27/1288
257/40
(Continued)

FOREIGN PATENT DOCUMENTS

JP   2002-318556 A   10/2002
JP      4016144 B2   12/2007
(Continued)

*Primary Examiner* — Thinh T Nguyen
(74) *Attorney, Agent, or Firm* — Lewis Roca Rothgerber Christie LLP

(57) ABSTRACT

An organic light emitting diode (OLED) display includes: a substrate; a scan line on the substrate, extending in a first direction, and configured to transmit a scan signal; a data line on the substrate, extending in a second direction crossing the first direction, and configured to transmit a data voltage; a common voltage line in the same layer as the data line and configured to transmit a common voltage; a first electrode on the data line and an assistance member on the common voltage line, the first electrode and the assistance member being separated from each other in the first direction or the second direction; a second electrode on the first electrode and the assistance member; and an organic emission layer between the first electrode and the second electrode. The assistance member is separated from the data line in the first direction.

6 Claims, 8 Drawing Sheets

(51) Int. Cl.
   *H01L 51/56* (2006.01)
   *H01L 51/00* (2006.01)
   *H01L 51/52* (2006.01)

(52) U.S. Cl.
   CPC .......... *H01L 51/5228* (2013.01); *H01L 51/56* (2013.01); *H01L 27/3223* (2013.01); *H01L 27/3246* (2013.01); *H01L 2251/5315* (2013.01); *H01L 2251/5392* (2013.01)

(58) Field of Classification Search
   CPC ............. H01L 51/5275; H01L 27/3244; H01L 51/5036; H01L 2221/5315; H01L 51/5234
   USPC .... 257/40, 59, 72, 758, E21.21; 438/82, 99, 438/48, 128
   See application file for complete search history.

(56) References Cited

U.S. PATENT DOCUMENTS

| | | | | |
|---|---|---|---|---|
| 2009/0261713 A1* | 10/2009 | Choi | ................... | H01L 27/3276 313/504 |
| 2010/0025664 A1* | 2/2010 | Park | ..................... | H01L 27/326 257/40 |
| 2010/0059754 A1* | 3/2010 | Lee | ..................... | H01L 27/322 257/59 |
| 2011/0248269 A1* | 10/2011 | Oh | ......................... | B82Y 10/00 257/59 |

FOREIGN PATENT DOCUMENTS

| | | |
|---|---|---|
| KR | 10-2014-0137710 A | 12/2014 |
| KR | 10-2015-0054125 A | 5/2015 |

\* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2015-0131110, filed in the Korean Intellectual Property Office on Sep. 16, 2015, the entire content of which is incorporated herein by reference.

BACKGROUND

1. Field

Aspects of embodiments of the present invention relate to an organic light emitting diode (OLED) display and a method of manufacturing method the OLED display.

2. Description of the Related Art

An OLED display may include a plurality of pixels, each of which may include an OLED made up of two electrodes and an organic light emitting layer positioned therebetween. Electrons injected from one of the electrodes, namely a cathode (which may be shared by or common to all of the pixels), and holes injected from the other one of the electrodes, namely an anode, are bonded to each other in the organic light emitting layer to form excitons. Light is emitted while the excitons discharge energy. Each of the pixels may also include a plurality of transistors and capacitors for driving the OLED. The transistors may include a switching transistor and a driving transistor.

The above information disclosed in this Background section is only to enhance the understanding of the background of the present invention and therefore it may contain information that does not form the prior art that is already known in this country to a person of ordinary skill in the art.

SUMMARY

Embodiments of the present invention provide for an OLED display and a manufacturing method of the OLED display that reduces or minimizes pixel defects in a laser shorting process.

In an embodiment of the present invention, an organic light emitting diode (OLED) display is provided. The OLED display includes: a substrate; a scan line on the substrate, extending in a first direction, and configured to transmit a scan signal; a data line on the substrate, extending in a second direction crossing the first direction, and configured to transmit a data voltage; a common voltage line in the same layer as the data line and configured to transmit a common voltage; a first electrode on the data line and an assistance member on the common voltage line, the first electrode and the assistance member being separated from each other in the first direction or the second direction; a second electrode on the first electrode and the assistance member; and an organic emission layer between the first electrode and the second electrode. The assistance member is separated from the data line in the first direction.

The assistance member may overlap the common voltage line in a thickness direction perpendicular to the first and second directions.

The OLED display may further include a shorting member connecting the assistance member to the second electrode.

The first electrode and the assistance member may be formed of the same material in the same layer.

The OLED display may further include an insulating layer covering the data line and the common voltage line, the assistance member being connected to the common voltage line through a contact hole formed in the insulating layer.

The data line may be bent or curved to correspond to a periphery of the assistance member.

The OLED display may further include a pixel definition layer having a first opening overlapping a part of the first electrode and a second opening overlapping a part of the assistance member.

In another embodiment of the present invention, a method of manufacturing an organic light emitting diode (OLED) display is provided. The method includes: forming a scan line extending in a first direction on a substrate; forming a data line and a common voltage line extending in a second direction crossing the first direction on the substrate; forming a first electrode on the data line and an assistance member on the common voltage line, the first electrode being separated from assistance member in the first direction or the second direction; forming an organic emission layer on the first electrode; and forming a second electrode on the organic emission layer and the assistance member. The assistance member is separated from the data line in the first direction.

The method may further include forming a shorting member connecting the second electrode to the assistance member by using a laser.

The method may further include forming a pixel definition layer having a first opening exposing a part of the first electrode and a second opening exposing a part of the assistance member.

The first opening may include a plurality of first openings in the second direction. The forming of the organic emission layer may include concurrently forming the organic emission layer in each of the first openings by using a deposition mask having a slit formed along the second direction.

The assistance member may overlap the common voltage line in a thickness direction perpendicular to the first and second directions.

The method may further include: forming an insulating layer covering the data line and the common voltage line, and forming a contact hole exposing a part of the common voltage line. The forming of the assistance member may include connecting the assistance member to the common voltage line through the contact hole.

The data line may be bent or curved to correspond to a periphery of the assistance member.

The forming of the first electrode and the assistance member may include forming the first electrode and the assistance member of the same material in the same layer.

According to the above and other embodiments of the present invention, when performing the laser shorting process between the second electrode and the assistance member, short-circuiting of the second electrode and the data line may be reduced or prevented. Accordingly, pixel defects generated by the shorting between the second electrode and the data line may be reduced or minimized.

DETAILED DESCRIPTION

Figure 1:
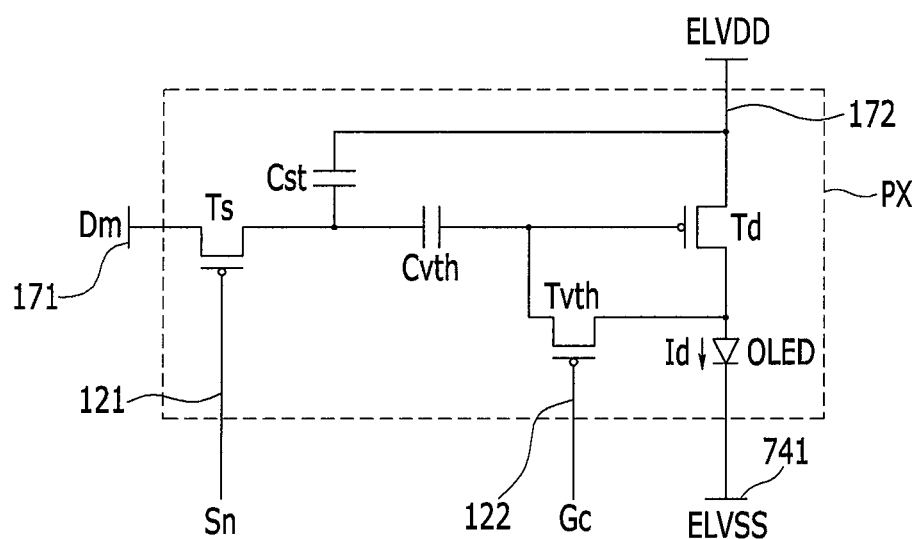
FIG. 1 is an equivalent circuit diagram of an example pixel of an OLED display according to an embodiment of the present invention.

The present invention will be described more fully hereinafter with reference to the accompanying drawings, in which example embodiments of the invention are shown. However, as those skilled in the art would realize, the described embodiments may be modified in various different ways, all without departing from the spirit or scope of the present invention.

The drawings and description are to be regarded as illustrative in nature and not restrictive. Like or similar reference numerals designate like or similar elements throughout the specification. Further, in the drawings, the size and thickness of each element may be exaggerated for better understanding and ease of description, but the present invention is not limited thereto. For example, in the drawings, the thickness of layers, films, panels, regions, etc., may be exaggerated for clarity. Further, in the drawings, for better understanding and ease of description, the thickness of some layers and areas may be exaggerated.

In addition, unless explicitly described to the contrary, the word "comprise" and variations such as "comprises" or "comprising" will be understood to imply the inclusion of stated elements, but not the exclusion of other elements. When a first part of a layer, a film, a plate, or the like is described as being arranged "on" or "over" a second part, this indicates that the first part may be arranged directly on or over (e.g., in a thickness direction) the second part or that there may be one or more third parts therebetween without limitation to the upper side thereof based on the direction of gravity. Furthermore, when the first part is described as being arranged "on" the second part, this indicates that the first part may be arranged at an upper side or a lower side (e.g., in the thickness direction) of the second part without limitation to the upper side thereof based on the direction of gravity.

Terms such as "connected" and "coupled" may refer to either a physical connection or an electrical connection depending on context, as would be apparent to one of ordinary skill. Further, "electrically connected" or "electrically coupled" may refer to circuits that are conductively coupled or resistively coupled (e.g., capable of transmitting current, or maintaining substantially the same voltage level throughout, etc.) or may further refer to circuits that are capacitively coupled (e.g., connected through a capacitor, where current does not flow through the capacitor, or different voltage levels are on both sides of the capacitor), depending on context, as would be apparent to one of ordinary skill.

It should be noted that while all physical structures occupy three dimensions, a linear or substantially linear structure (as would be apparent to one of ordinary skill), such as a wire or signal line, will be said to "extend" in a particular direction if that structure takes on its greatest measurement (or length or linearity) in that particular direction.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Further, in the specification, the term "plan view" means when an object portion is viewed from above (e.g., x- and y-dimensions, length and width, first and second directions, etc.), and the term "cross sectional view" means when a cross section taken by vertically cutting an object portion is viewed from the side (e.g., z-dimension, thickness, third direction, etc.)

In addition, embodiments of the present invention are not limited to the number of transistors and capacitors shown in the accompanying drawings, and in the OLED display, each pixel may be provided with a plurality of transistors and at least one capacitor, and may be formed to have various structures by further forming additional wires or omitting existing wires. The pixel may be a minimum unit (e.g., a minimum addressable unit) for displaying an image, and the OLED display may display images through a plurality of pixels. Further, the pixels may be driven by a matrix of scan lines extending in a first direction and data lines extending in a second direction crossing the first direction (e.g., perpendicular to the first direction).

As an OLED display increases in size, effects such as screen stains may be generated by a voltage drop of the (common) cathode. For example, for a top emission OLED display, a common cathode may be fabricated from a transparent material, such as indium tin oxide (ITO) or indium zinc oxide (IZO). However, ITO and IZO have relatively large resistance, which may lead to a voltage drop when driving such a common cathode in a large OLED display. To help reduce or prevent screen stains or other phenomena of large cathode designs, in embodiments of the present invention, common voltage lines or meshes (e.g., metal lines or interconnected metal lines (meshes) having low resistance) may be formed in the display area, such as parallel to the data lines, and connected to the cathode at regular points (such as every pixel), to reduce or minimize the voltage drop of the cathode.

One technique of connecting the cathode to the common voltage lines is to use a laser shorting process. However, when circumstances such as the power of the laser not being uniform or the accuracy not being perfect (e.g., resulting in alignment errors) take place, data lines near the common voltage lines may be negatively affected (e.g., signals may be degraded or even short circuited with the cathode) by the laser in the laser shorting process, thereby causing unintended effects such as pixel defects.

Now, OLED displays according to example embodiments of the present invention will be described with reference to the accompanying drawings.

FIG. 1 is an equivalent circuit diagram of an example pixel PX of an OLED display according to an embodiment of the present invention.

As shown in FIG. 1, the pixel PX may include a plurality of signal lines 121, 122, 171, 172, and 741, a plurality of transistors Td, Ts, and Tvth connected to the signal lines, a plurality of capacitors Cst and Cvth, and an OLED. The transistors Td, Ts, and Tvth may include a driving transistor Td, a switching transistor Ts, and a compensation transistor Tvth. The capacitors Cst and Cvth may include a storage capacitor Cst and a compensation capacitor Cvth.

The signal lines 121, 122, 171, 172, and 741 may include a scan line 121 extending in a first direction and for transmitting a scan signal Sn to the switching transistor Ts, a compensation control line 122 for transmitting a compensation control signal Gc to the compensation transistor Tvth, a data line 171 extending in a second direction crossing the scan line 121 (and the first direction) and for transmitting a data voltage Dm to the switching transistor, a driving voltage line 172 for transmitting a driving voltage ELVDD to the driving transistor Td, and a common voltage line 741 for transmitting a common voltage ELVSS to a cathode of the OLED.

The driving transistor Td may include a gate electrode connected to a second terminal of the compensation capacitor Cvth, a source electrode connected to the driving voltage line 172, and a drain electrode electrically connected to an anode of the OLED. The driving transistor Td may supply current to the OLED in response to, e.g., the voltage charged in the compensation capacitor Cvth and the storage capacitor Cst.

The compensation transistor Tvth may include a gate electrode connected to the compensation control line 122, a source electrode connected to the drain electrode of the driving transistor Td and the anode of the OLED, and a drain electrode connected to the second terminal of the compensation capacitor Cvth and the gate electrode of the driving transistor Td. The compensation transistor Tvth may be turned on in response to the compensation control signal Gc transmitted through the compensation control line 122, to connect the gate electrode to the drain electrode of the driving transistor Td (e.g., diode-connect the driving transistor Td). A voltage corresponding to a threshold voltage of the driving transistor Td may be stored or programmed in the compensation capacitor Cvth when the driving transistor Td is diode connected.

The gate electrode of the switching transistor Ts may be connected to the scan line 121, the source electrode of the switching transistor Ts may be connected to the data line 171, and the drain electrode of the switching transistor Ts may be connected to a second terminal of the storage capacitor Cst and a first terminal of the compensation capacitor Cvth. The switching transistor Ts may be turned on in response to the scan signal Sn transmitted through the scan line 121.

A first terminal of the storage capacitor Cst may be connected to the driving voltage line 172. A gate-source voltage of the driving transistor Td may depend on or be controlled by the stored or programed voltage in the compensation capacitor Cvth and the storage capacitor Cst. The cathode of the OLED may be connected to the common voltage line 741 transmitting the common voltage ELVSS. The OLED may emit light in response to a driving current Id transmitted through the driving transistor Td from the driving voltage line 172 to the common voltage line 741.

While a 3-transistor, 2-capacitor pixel PX is illustrated in FIG. 1, the present invention is not limited thereto, and in other embodiments, the number of transistors and capacitors may vary from these numbers.

Hereinafter, a more detailed structure of the OLED display shown in FIG. 1 will be described with reference to FIG. 2 and FIG. 3.

Figure 2:
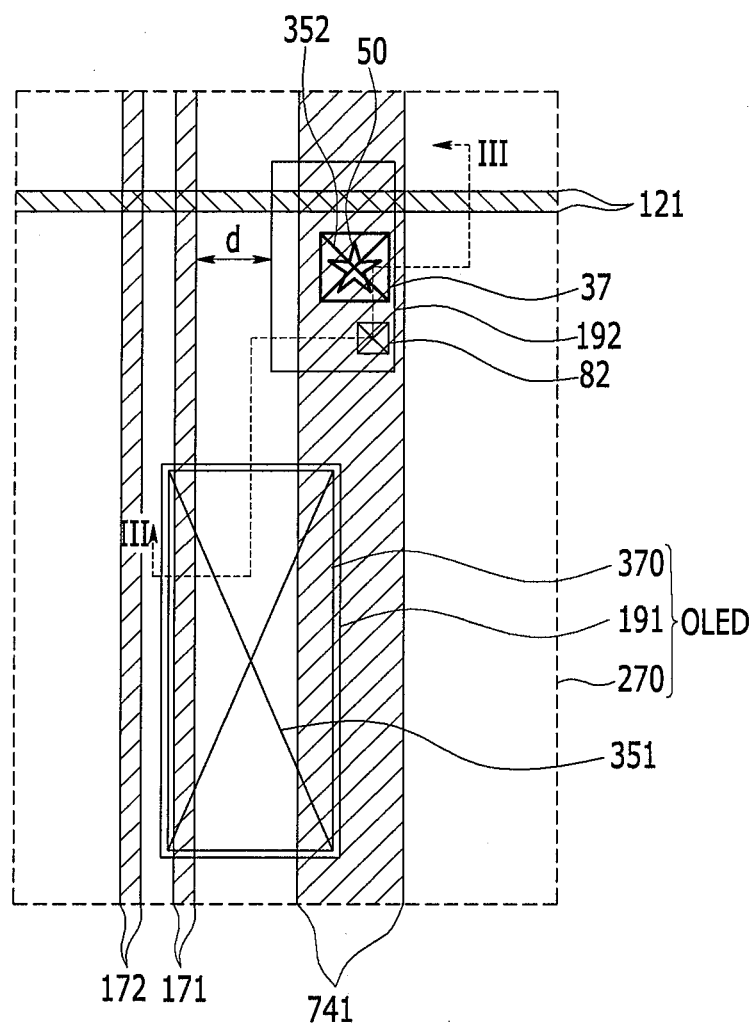
FIG. 2 is a plan view of an example of the pixel of FIG. 1 according to an embodiment of the present invention.

FIG. 2 is a plan view of an example of the pixel PX of FIG. 1 according to an embodiment of the present invention.

Figure 3:
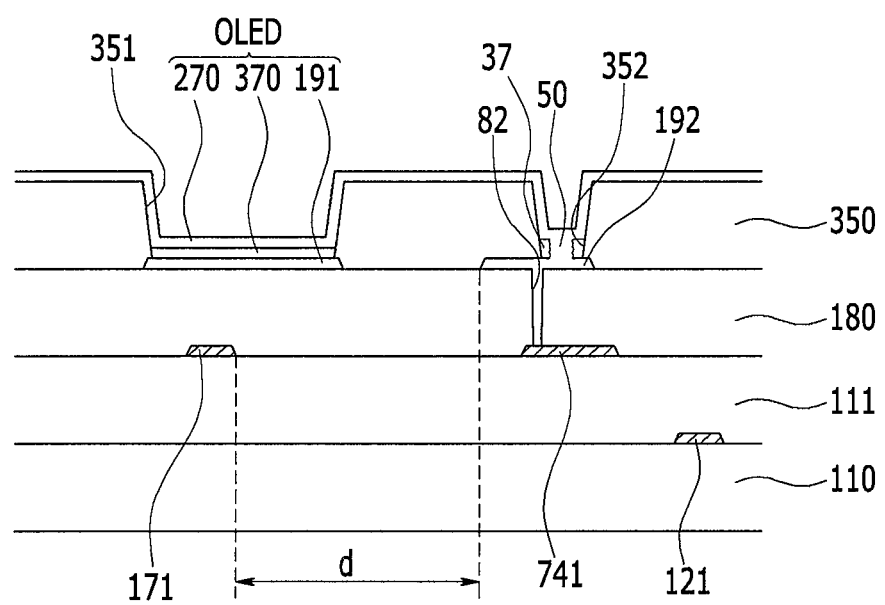
FIG. 3 is an example cross-sectional view taken along line III-III of FIG. 2 according to an embodiment of the present invention.

FIG. 3 is a cross-sectional view of an example of the pixel of FIG. 2 taken along line III-III according to an embodiment of the present invention.

As shown in FIG. 2 and, FIG. 3, the scan line 121 for transmitting the scan signal Sn extends in a first direction, the data line 171 crossing the scan line 121 and for transmitting the data voltage Dm extends in a second direction crossing the first direction (e.g., perpendicular to the first direction), and the driving voltage line 172 crossing the scan line 121 and for transmitting the driving voltage ELVDD are positioned on a substrate 110. The substrate 110 may be formed of an insulating substrate made of, for example, glass, quartz, ceramic, or plastic. The scan line 121 may be formed, for example, of one or multiple layers in which a metal layer that includes one or more of copper (Cu), copper alloys, aluminum (Al), aluminum alloys, molybdenum (Mo), and molybdenum alloys is deposited.

A switching element layer 111 may be connected to the scan line 121 and the data line 171, and may be positioned between the scan line 121 and the data line 171. At least one transistor and one capacitor may be formed in the switching element layer 111.

The common voltage line 741 for transmitting the common voltage ELVSS may be positioned in the same layer as the data line 171 and may also extend in the second (data line) direction. The data line 171, the driving voltage line 172, and the common voltage line 741 may be formed entirely or nearly (e.g., substantially) parallel to each other (e.g., extend in the second direction) and in the same layer and of the same material. The data line 171, the driving voltage line 172, and the common voltage line 741 may be formed, for example, of one or multiple layers in which a metal layer that includes one or more of copper (Cu), copper alloys, aluminum (Al), aluminum alloys, molybdenum (Mo), and molybdenum alloys is deposited. For example, the data line 171, the driving voltage line 172, and the common voltage line 741 may be formed of a triple layer of titanium/aluminum/titanium (Ti/Al/Ti), molybdenum/aluminum/molybdenum (Mo/Al/Mo), or molybdenum/copper/molybdenum (Mo/Cu/Mo).

An insulating layer 180 covering both the data line 171 and the common voltage line 741 may be formed on the data line 171 and the common voltage line 741. The insulating layer 180 may be formed, for example, of an organic material, such as a polyacryl-based resin, a polyimide-based resin, or a deposition layer of the organic material and an inorganic material.

A first electrode 191 (of an OLED, such as an anode of the OLED) and an assistance member 192 may be formed on the insulating layer 180 separated from each other in the first direction or the second direction. For example, the first electrode 191 may be formed on the data line 171 and the assistance member 192 may be formed on the common voltage line 741. The first electrode 191 and the assistance member 192 may be formed of the same material and positioned in the same layer, but are not directly connected to each other.

In top emission OLED displays, the first electrode 191 and the assistance member 192 may be made of a conductor having high reflectance. The assistance member 192 may overlap the common voltage line 741 in plan view (e.g., in a third direction or thickness direction perpendicular to both the first and second directions) and may assist in transmitting a voltage from the common voltage line 741 to a cathode (e.g., a common cathode) of the OLEDs as will be described in further detail below. The assistance member 192 may be connected to the common voltage line 741 through a contact hole 82 formed in the insulating layer 180.

A pixel definition layer 350 covering the first electrode 191 and the assistance member 192 may be formed on the insulating layer 180. The pixel definition layer 350 may include a first opening 351 overlapping or exposing most of the first electrode 191 and a second opening 352 overlapping or exposing part of the assistance member 192. The pixel definition layer 350 may be made, for example, of an organic material, such as a polyacrylate resin and a polyimide resin, or silica-series inorganic materials.

An organic emission layer 370 may be formed on the first electrode 191 (e.g., on the exposed portion of the first electrode 191). In the process, a dummy organic emission layer 37 may also be formed on the assistance member 192. Here, "dummy" refers to the inoperability of the dummy organic emission layer 37 as a functioning organic emission layer (e.g., incapable of emitting light). The organic emission layer 370 and the dummy organic emission layer 37 may be formed of the same material in the same layer.

The organic emission layer 370 may be made of a low-molecular organic material or a high-molecular organic material such as poly(3,4-ethylenedioxythiophene) (PE-DOT). Further, the organic emission layer 370 may be formed of multiple layers, including an emission layer and at least one of a hole injection layer (HIL), a hole transporting layer (HTL), an electron transporting layer (ETL), and an electron injection layer (EIL). When the organic emission layer 370 includes all of the layers, the hole injection layer may be disposed on the first electrode (or pixel electrode) 191, which is the positive electrode, and the hole transporting layer, the emission layer, the electron transporting layer, and the electron injection layer may be sequentially laminated thereon.

The organic emission layer 370 may include a red organic emission layer for emitting red light, a green organic emission layer for emitting green light, and a blue organic emission layer for emitting blue light. The red organic emission layer, the green organic emission layer, and the blue organic emission layer may be formed on red pixels, green pixels, and blue pixels, respectively, to implement color images.

A second electrode (e.g., common electrode) 270 may be formed on the pixel definition layer 350, the organic emission layer 370, and the dummy organic emission layer 37. In top emission OLED displays, the second electrode 270 may be formed of a transparent conductor such as ITO (Indium Tin Oxide) or IZO (Indium Zinc Oxide).

Herein, the first electrode 191 may be an anode and perform as the hole injection electrode, while the second electrode 270 may be a cathode and perform as the electron injection electrode. However, the present invention is not necessarily limited thereto, and in other embodiments (e.g., depending on a driving method of the OLED display device), the first electrode 191 may be the cathode while the second electrode 270 may be the anode.

A shorting member 50 for connecting the assistance member 192 to the second electrode 270 may be formed in (e.g., by partially combining or melting) the assistance member 192, the dummy organic emission layer 37, and the second electrode 270. The shorting member 50 may be formed, for example, by short-circuiting the assistance member 192 and the second electrode 270 at a location corresponding to the dummy organic emission layer 37 by using a laser. Accordingly, the shorting member 50 may be a mixture of the material forming the assistance member 192, the material forming the dummy organic emission layer 37, and the material forming the second electrode 270.

The assistance member 192 may connect (or assist in connecting) the second electrode 270 to the common voltage line 741. The size of the second electrode 270 may increase as the size of the OLED display increases. Accordingly, as the size of the OLED display increases, voltage drop may be easily generated in the second electrode 270 formed of ITO (Indium Tin Oxide) or IZO (Indium Zinc Oxide) having low conductivity. However, by connecting the common voltage line 741 made of metal having high conductivity to the second electrode 270, resistance may be reduced or minimized such that the voltage drop of the second electrode 270 may be reduced or minimized.

FIG. 2 only shows part of the common voltage line 741 (namely, a portion extending in the second direction parallel to the data line 171). However, the common voltage line 741 may be formed in each pixel in the second direction (e.g., running parallel to the data lines 171, such as the length of the display area) and with extensions in the first direction (to interconnect the common voltage lines 741 in the second direction) to produce a mesh shape such that the voltage drop of the second electrode 270 may be reduced or minimized.

As shown in FIG. 2 and FIG. 3, the assistance member 192 is separated from the data line 171 in the first (or scan line) direction by a set or predetermined interval or distance d (e.g., in the plan view illustration of FIG. 2, the separation of distance d in the first or scan line (121) direction between the data line 171 and the assistance member 192 is apparent, where the data line 171 extends in the second direction). That is, the assistance member 192 may not overlap the data line 171 in the third (or thickness) direction, as illustrated in the plan view of FIG. 2. Here, "in plan view" means the structure of the assistance member 192 and the data line 171 when viewing the assistance member 192 and the data line 171 from above, as shown in FIG. 2.

As described above, since the assistance member 192 does not overlap the data line 171 (even further, is separated by a distance d from the assistance member in the first direction), when forming the shorting member 50 in the dummy organic emission layer 37 by using the laser to connect the assistance member 192 and the second electrode 270, even if the power of the laser is not uniform or an alignment error is generated, the assistance member 192 (connected to the second electrode 270) and the data line 171 may not short circuit. Accordingly, defects resulting from short-circuiting the second electrode 270 and the data line 171 may be reduced or minimized.

On the other hand, if the assistance member 192 overlaps the data line 171, then when radiating the laser to short-circuit the second electrode 270 and the assistance member 192 (to form the shorting member 50), if unintended circumstances such as the power of the laser is not uniform or an alignment error is generated, the assistance member 192 and the data line 171 may short circuit. To help reduce or prevent this, in OLED displays according to embodiments of the present invention, the assistance member 192 may be separated from the data line 171 in the first direction (e.g., separated by a set or predetermined distance d).

An encapsulation member protecting the OLED may be formed on the second electrode 270. For example, the encapsulation member may be attached to the substrate 110 by a sealant, and may be made of various materials, such as one or more of glass, quartz, ceramic, plastic, and metal. In other embodiments, a thin film encapsulation layer may be formed by depositing an inorganic layer and an organic layer on the second electrode 270 without using a sealant.

An example method of manufacturing the OLED display according to an embodiment of the present invention will be described in further detail with reference to FIG. 4, FIG. 5, FIG. 6, and FIG. 7.

Figure 4:
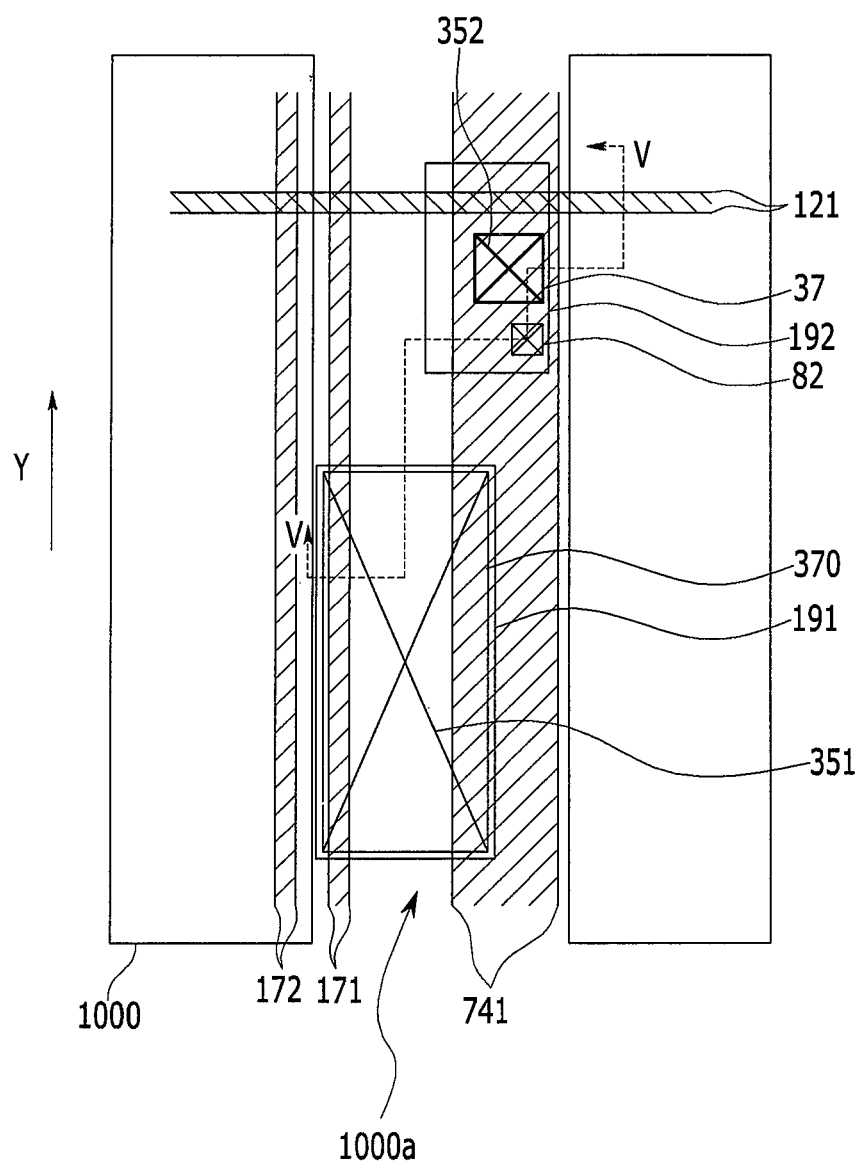
FIGS. 4 and 6 are plan views illustrating an example method of manufacturing a display device having the pixel of FIGS. 2-3 according to an embodiment of the present invention.
Figure 5:
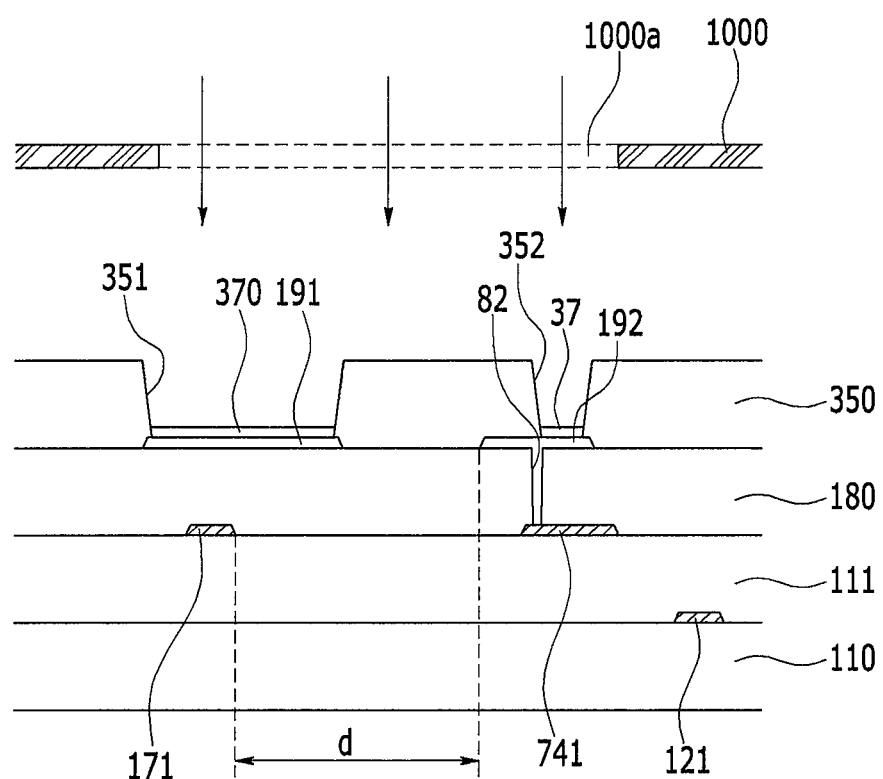
FIG. 5 is an example cross-sectional view taken along line V-V of FIG. 4 according to an embodiment of the present invention.
Figure 6:
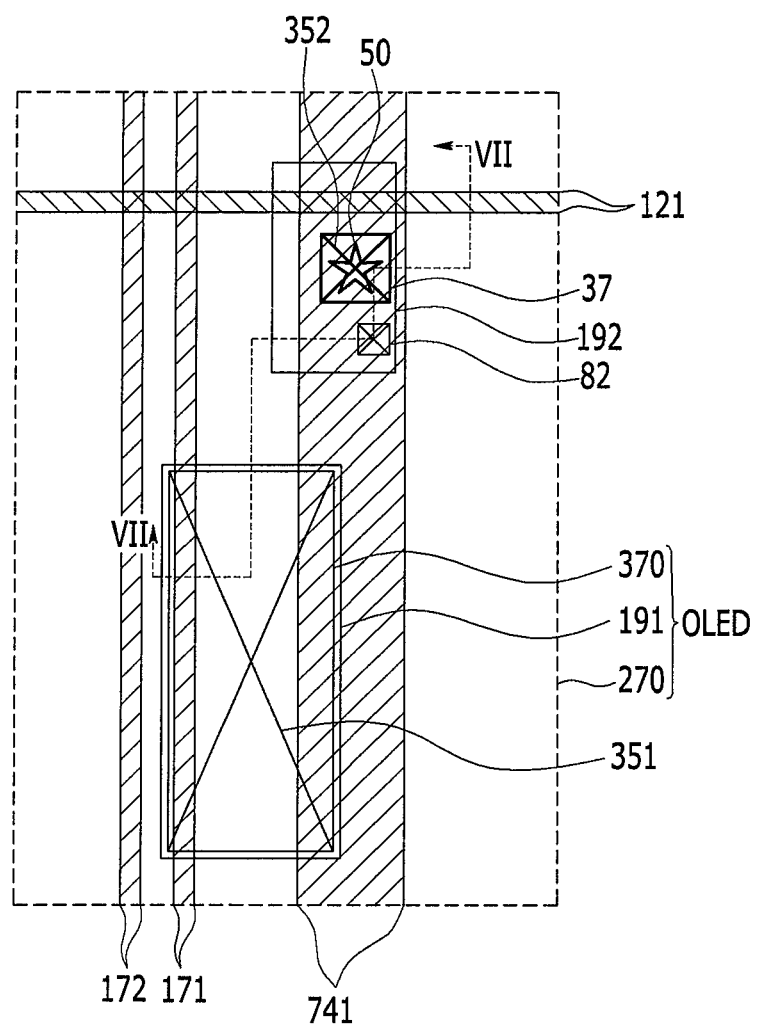
Figure 7:
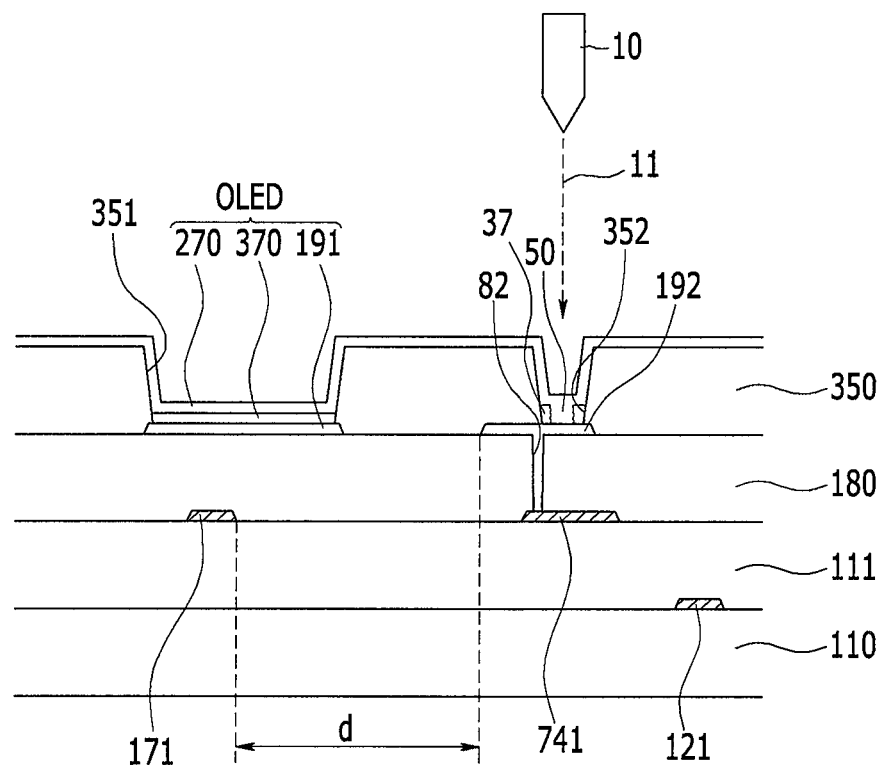
FIG. 7 is an example cross-sectional view taken along line VII-VII of FIG. 6 according to an embodiment of the present invention.

FIGS. 4 and 6 are plan views illustrating an example method of manufacturing a display device having the pixel of FIGS. 2-3 according to an embodiment of the present invention. FIG. 5 is an example cross-sectional view taken along line V-V of FIG. 4. FIG. 7 is an example cross-sectional view taken along line VII-VII of FIG. 6.

As shown in FIG. 4 and FIG. 5, the scan line 121 may be formed on the substrate 110, extending on the substrate in a first direction. The switching element layer 111 may be formed on the scan line 121. The data line 171 (connected to the switching element layer 111 and extending in a second direction crossing (e.g., perpendicular to) the first direction), the driving voltage line 172, and the common voltage line 741 may be formed on the switching element layer 111 and extending in the second direction.

The insulating layer 180 may be formed on the data line 171, the driving voltage line 172, the common voltage line 741, and the switching element layer 111. Further, the contact hole 82 may be formed in the insulating layer 180 to overlap or expose a part of the common voltage line 741. In addition, the first electrode 191 and the assistance member 192 may be formed on the insulating layer 180 and separated from each other in the first direction or the second direction. The assistance member 192 may be connected to the common voltage line 741 through the contact hole 82. The assistance member 192 may be separated from the data line 171 by a set or predetermined distance d in the first (or scan line) direction.

In addition, the pixel definition layer 350 may be formed on the insulating layer 180 to cover the first electrode 191 and the assistance member 192. Further, the first opening 351 and the second opening 352 may be formed in the pixel definition layer 350, the first opening 351 overlapping or exposing most (e.g., all but a peripheral portion) of the first electrode 191 and the second opening 352 overlapping or exposing a part (e.g., a part sufficient to perform a laser connection to electrically connect the assistance member 192 to subsequent conductive layers, as would be apparent to one of ordinary skill) of the assistance member 192.

The organic emission layer 370 may be formed on the first electrode 191 concurrently with forming the dummy organic emission layer 37 on the assistance member 192. For example, the organic emission layer 370 may be concurrently formed in a plurality of first openings 351 (e.g., one for each pixel) formed along the second direction (or data line direction, identified by Y in FIG. 4) by using a deposition mask 1000 having an opening 1000a of a slit shape formed along the second direction Y (e.g., to correspond to all of the pixels receiving data signals from the data line 171).

By contrast, in large-sized OLED displays, when depositing the organic emission layer 370 by using a large-sized deposition mask having openings corresponding to each of the first openings 351 of the pixel definition layer 350, defects may be easily generated by an alignment error, such as an alignment error in the Y (or data line) direction. To reduce or prevent this, in embodiments of the present invention, multiple openings corresponding to each of the first openings 351 of the pixel definition layer 350 for the same data line 171 are not formed in the deposition mask 1000, but rather the single opening 1000a of the slit shape corresponding to all of the first openings 351 formed along the second direction Y for the data line 171 is formed in the deposition mask 1000 (e.g., a separate slit-shape opening 1000a for each data line 171), to concurrently deposit the organic emission layer 370 on all first openings 351 corresponding to each data line 171.

In the process, the dummy organic emission layer 37 may be concurrently formed on each of the assistance members 192 corresponding to the same data line 171 through the same slit 1000a. For example, the slit 1000a may be wide enough (in the first direction) to encompass the data line 171 and the common voltage line 741, the slit 1000a extending the length of the display area in the second direction and being bounded in the first direction by the first openings 351 and the second openings 352.

Referring now to FIG. 6 and FIG. 7, the second electrode 270 may be formed on the pixel definition layer 350. For example, the second electrode 270 may be formed on the organic emission layer 370 formed in the first opening 351 and the dummy organic emission layer 37 formed in the second opening 352.

High temperature heat may be momentarily and selectively applied to the assistance member 192, the dummy organic emission layer 37, and the second electrode 270 by using a laser 11 generated from a laser generator 10. Accordingly, the shorting member 50 connecting the assistance member 192 and the second electrode 270 through the dummy organic emission layer 37 may be formed. For example, the second electrode 270 and the assistance member 192 may be connected through the shorting member 50, and the assistance member 192 may be connected to the common voltage line 741 through the contact hole 82. Consequently, the second electrode 270 may be connected to the common voltage line 741.

This process may be carried out for each pixel. For example, the common voltage line 741 may be formed in a mesh shape for each pixel (e.g., extending the common voltage line 741 in the second direction to correspond to the data line 171 while connecting adjacent common voltage lines 741 at regular intervals (such as every pixel) to form the mesh shape) such that the voltage drop of the second electrode 270 may be reduced or minimized.

By separating the assistance member 192 from the data line 171 in the first direction by the set or predetermined distance d, when radiating the laser 11 to form the shorting member 50, the assistance member 192 (connected to the second electrode 270) may reduce the likelihood of or prevent the data line 171 from being short-circuited. Accordingly, pixel defects generated by the short-circuiting between the second electrode 270 and the data line 171 may be reduced or minimized.

In other embodiments, the position and size of the assistance member may be controlled to not overlap the data line. In still other embodiments, the shape of the data line may be changed so that the assistance member and the data line do not overlap each other. For example, an OLED display according to another embodiment of the present invention will be described with reference to FIG. 8.

Figure 8:
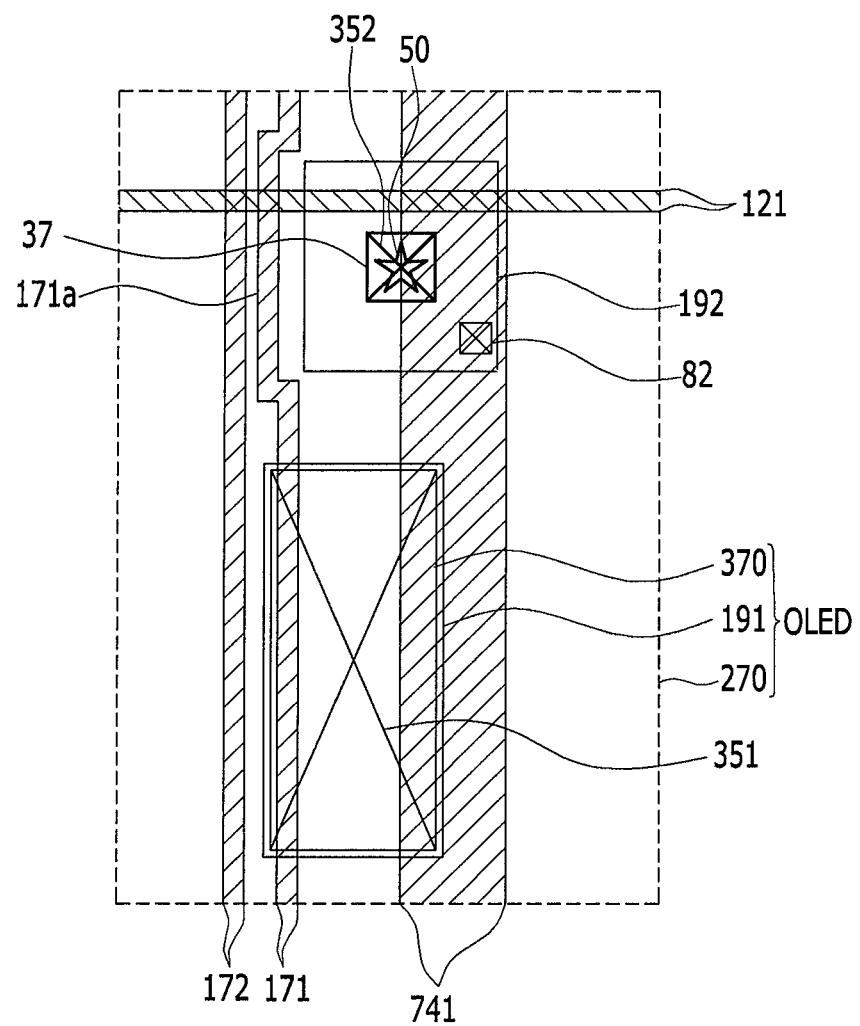
FIG. 8 is a plan view of an example of the pixel of FIG. 1 according to another embodiment of the present invention.

FIG. 8 is a plan view of an example of the pixel of FIG. 1 according to another embodiment of the present invention.

The embodiment shown in FIG. 8 is substantially the same as the embodiment shown in FIG. 1, FIG. 2, and FIG. 3, except for the data line and the assistance member, such that a duplicate description of the same or similar elements may not be repeated.

As shown in FIG. 8, the scan line 121 (extending in a first direction) for transmitting the scan signal Sn, the data line 171 crossing the scan line 121 (in a second direction) and for transmitting the data voltage Dm, and the driving voltage line 172 crossing the scan line 121 and for transmitting the driving voltage ELVDD may be formed on the substrate 110. A part 171a of the data line 171 may be bent or curved in the first direction to correspond to a periphery of the assistance member 192.

The common voltage line 741 for transmitting the common voltage ELVSS may be positioned in the same layer as the data line 171. The insulating layer 180 covering the data line 171 and the common voltage line 741 may be formed on the data line 171 and the common voltage line 741 (referring to FIG. 3). The first electrode 191 and the assistance member 192 may be separated from each other in the first direction or the second direction and on the insulating layer 180. The assistance member 192 may overlap the common voltage line 741 in the third (or thickness) direction.

In FIG. 8, the data line 171 may be bent or curved along or corresponding to a periphery of the assistance member 192. Accordingly, the data line 171 does not overlap the assistance member 192 in the third direction. As described above, since the assistance member 192 does not overlap the data line 171, when forming the shorting member 50 by using the laser to connect the assistance member 192 and the second electrode 270, the assistance member 192 (connected to the second electrode 270) and the data line 171 may be prevented (or the likelihood reduced) from being short-circuited due to circumstances such as the non-uniformity of the power of the laser or misalignment of the laser. Accordingly, line defects generated by the short-circuiting between the second electrode 270 and the data line 171 may be reduced or minimized.

While the present invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

| Description of some symbols | |
|---|---|
| 110: substrate | 121: scan line |
| 171: data line | 172: driving voltage line |
| 180: insulating layer | 191: first electrode |
| 192: assistance member | 270: second electrode |
| 350: pixel definition layer | 351: first opening |
| 352: second opening | 370: organic emission layer |
| 37: dummy organic emission layer | 50: shorting member |

What is claimed is:

1. An organic light emitting diode (OLED) display comprising:
   a substrate;
   a scan line on the substrate, extending in a first direction, and configured to transmit a scan signal;
   a data line on the substrate, extending in a second direction crossing the first direction, and configured to transmit a data voltage;
   a common voltage line in the same layer as the data line and configured to transmit a common voltage;
   a first electrode on the data line and an assistance member on the common voltage line, the first electrode and the assistance member being separated from each other in the first direction or the second direction;
   a second electrode on the first electrode and the assistance member;
   an organic emission layer between the first electrode and the second electrode;
   a shorting member connecting the assistance member to the second electrode; and
   a dummy organic emission layer that is incapable of emitting light, that comprises a same material as the organic emission layer and is located between the assistance member and the second electrode, and that surrounds the shorting member,
   wherein the assistance member is separated from the data line in the first direction in a plan view.

2. The OLED display of claim 1, wherein the assistance member overlaps the common voltage line in a thickness direction perpendicular to the first and second directions.

3. The OLED display of claim 1, wherein the first electrode and the assistance member are formed of the same material in the same layer.

4. The OLED display of claim 1, further comprising an insulating layer covering the data line and the common voltage line, the assistance member being connected to the common voltage line through a contact hole formed in the insulating layer.

5. The OLED display of claim 1, wherein the data line is bent or curved to correspond to a periphery of the assistance member.

6. The OLED display of claim 1, further comprising a pixel definition layer having a first opening overlapping a part of the first electrode and a second opening overlapping a part of the assistance member.

* * * * *